United States Patent
Nashiki et al.

(10) Patent No.: US 9,332,633 B2
(45) Date of Patent: *May 3, 2016

(54) TRANSPARENT CONDUCTIVE FILM

(71) Applicant: NITTO DENKO CORPORATION, Ibaraki-shi, Osaka (JP)

(72) Inventors: Tomotake Nashiki, Osaka (JP); Motoki Haishi, Osaka (JP); Tomonori Noguchi, Osaka (JP); Kuniaki Ishibashi, Osaka (JP); Daisuke Kajihara, Osaka (JP)

(73) Assignee: NITTO DENKO CORPORATION, Ibaraki-shi (JP)

(*) Notice: Subject to any disclaimer, the term of this patent is extended or adjusted under 35 U.S.C. 154(b) by 126 days.

This patent is subject to a terminal disclaimer.

(21) Appl. No.: 14/152,273

(22) Filed: Jan. 10, 2014

(65) Prior Publication Data

US 2014/0124247 A1 May 8, 2014

Related U.S. Application Data

(62) Division of application No. 13/644,008, filed on Oct. 3, 2012, now Pat. No. 8,669,476.

(30) Foreign Application Priority Data

Oct. 6, 2011 (JP) ................. 2011-221951

(51) Int. Cl.
*H05K 1/02* (2006.01)
*G06F 3/041* (2006.01)
(Continued)

(52) U.S. Cl.
CPC .............. *H05K 1/0274* (2013.01); *G06F 3/041* (2013.01); *H01L 31/1884* (2013.01); *H05K 1/09* (2013.01); *G06F 2203/04103* (2013.01); *H05K 2201/0326* (2013.01); *Y02E 10/50* (2013.01)

(58) Field of Classification Search
CPC ........ H05K 1/0274; H05K 1/09; G06F 3/041; H01L 31/1884
USPC ......................................................... 174/251
See application file for complete search history.

(56) References Cited

U.S. PATENT DOCUMENTS 8,068,186 B2  11/2011  Aufderheide et al.
8,669,476 B2 *  3/2014  Nashiki et al. ................. 174/257
(Continued)

FOREIGN PATENT DOCUMENTS

AU     2004284746 A1    5/2005
EP      1 678 599        7/2010
(Continued)

OTHER PUBLICATIONS

Japanese Office Action dated Nov. 28, 2012, issued in corresponding Japanese patent application No. 2011-221951.

*Primary Examiner* — Timothy Thompson
*Assistant Examiner* — Charles Pizzuto
(74) *Attorney, Agent, or Firm* — Westerman, Hattori, Daniels & Adrian, LLP

(57) ABSTRACT

There is provided a transparent conductive film which comprises: a film substrate; a plurality of transparent conductor patterns formed on the film substrate; and a pressure-sensitive adhesive layer wherein the transparent conductor patterns are embedded. The plurality of transparent conductor patterns respectively have a two-layer structure wherein a first indium tin oxide layer and a second indium tin oxide layer are laminated on the film substrate in this order, and the first indium tin oxide layer has a greater tin oxide content than the second indium tin oxide layer does. The first indium tin oxide layer has a smaller thickness than the second indium tin oxide layer does.

10 Claims, 1 Drawing Sheet

A-A Cross Section

(51) Int. Cl.
   *H01L 31/18*   (2006.01)
   *H05K 1/09*    (2006.01)

(56)          References Cited

U.S. PATENT DOCUMENTS

| | | |
|---|---|---|
| 2003/0087119 A1 | 5/2003 | Iwabuchi et al. |
| 2004/0151895 A1* | 8/2004 | Itoh et al. ................. 428/327 |
| 2005/0083307 A1 | 4/2005 | Aufderheide et al. |
| 2010/0247810 A1 | 9/2010 | Yukinobu et al. |
| 2010/0288531 A1 | 11/2010 | Koyama et al. |
| 2010/0323166 A1 | 12/2010 | Chang et al. |
| 2011/0290322 A1 | 12/2011 | Meguro et al. |
| 2013/0087372 A1* | 4/2013 | Nashiki et al. ................. 174/257 |

FOREIGN PATENT DOCUMENTS

| | | | |
|---|---|---|---|
| EP | 1 678 599 B1 | 7/2010 | |
| JP | 2007-508639 A | 4/2007 | |
| JP | 2010-002958 A | 1/2010 | |
| JP | 2011-103289 A | 5/2011 | |
| JP | 2011103289 AH * | 5/2011 | ............... H01B 5/14 |
| JP | 2011103289 AI * | 5/2011 | ............... H01B 5/14 |
| WO | 2005/040901 A2 | 5/2005 | |
| WO | 2005/040901 A3 | 5/2005 | |
| WO | 2011/048648 A1 | 4/2011 | |
| WO | 2012/161095 A1 | 11/2012 | |

* cited by examiner

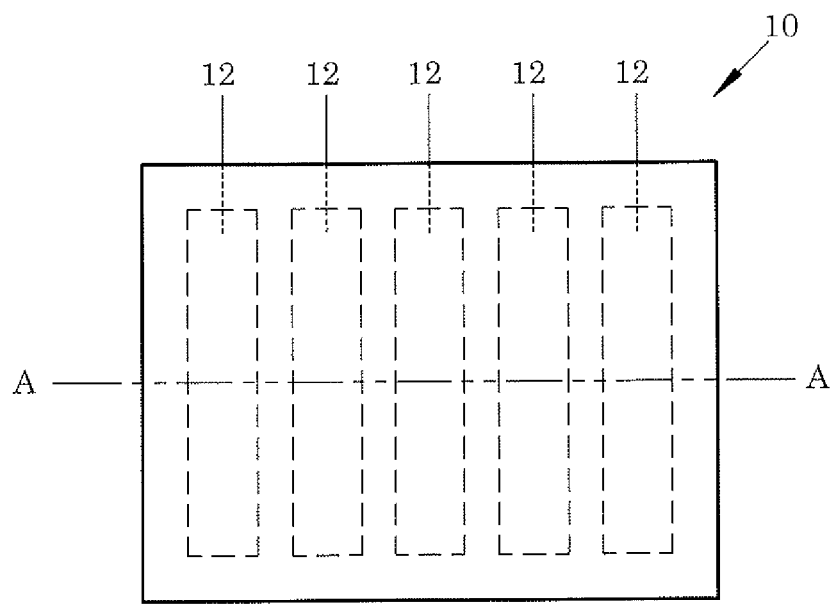
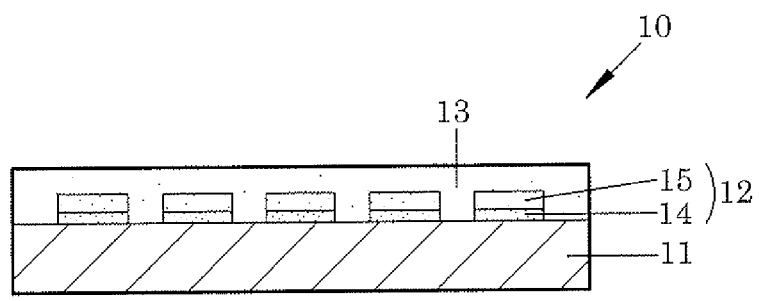
A-A Cross Section

TRANSPARENT CONDUCTIVE FILM

CROSS-REFERENCE OF RELATED APPLICATION

This application is a Divisional application Ser. No. 13/644,008, filed on Oct. 3, 2012, which claims priority of Japanese Patent Application No. 2011-221951, the entire contents of which are incorporated herein by reference.

BACKGROUND OF THE INVENTION

1. Field of the Invention

The present invention relates to a transparent conductive film using an ITO (Indium Tin Oxide).

2. Description of Related Art

A transparent conductive film including a film substrate, a transparent conductor pattern, and a filler material is known (Japanese Unexamined Patent Application Publication No. JP 2007-508639 A). The film substrate has a coating layer made of silica dioxide or the like. The transparent conductor pattern is formed on the coating layer. The filler material is formed on the film substrate so as to embed the transparent conductor pattern. The transparent conductor pattern is typically composed of an ITO (Indium Tin Oxide) layer. Such a transparent conductive film is typically used for a capacitance-type touch panel and the transparent conductor pattern thereof is less visible. There is a case where transparent conductor patterns in conventional transparent conductive films are still visible (It is preferable for the transparent conductor patterns to be invisible at all).

SUMMARY OF THE INVENTION

It is an object of the present invention to provide a transparent conductive film in which transparent conductor patterns are less visible than ever before.

The summary of the present invention is as follows:

In a first preferred aspect, a transparent conductive film according to the present invention comprises: a film substrate; a plurality of transparent conductor patterns formed on the film substrate; a pressure-sensitive adhesive layer formed on the film substrate wherein the plurality of transparent conductor patterns are embedded. The transparent conductor patterns respectively have a two-layer structure wherein a crystalline layer of first indium tin oxide and a crystalline layer of second indium tin oxide are laminated on the film substrate in this order. The crystalline layer of first indium tin oxide has a greater tin oxide content than the crystalline layer of second indium tin oxide does. The "indium tin oxide" is so-called an ITO (Indium Tin Oxide).

In a second preferred aspect of the transparent conductive film according to the present invention, the crystalline layer of first indium tin oxide and the crystalline layer of second indium tin oxide are formed by respectively crystallizing an amorphous layer of indium tin oxide by heat treatment.

In a third preferred aspect of the transparent conductive film according to the present invention, the crystalline layer of first indium tin oxide has a thickness smaller than that of the crystalline layer of second indium tin oxide.

In a fourth preferred aspect of the transparent conductive film according to the present invention, a material of the film substrate includes polyethylene tetraphthalate, polycycloolefin or polycarbonate.

In a fifth preferred aspect of the transparent conductive film according to the present invention, the plurality of transparent conductor patterns respectively have a thickness (thickness of the crystalline layer of first indium tin oxide+thickness of the crystalline layer of second indium tin oxide) of 10 nm to 45 nm.

In a sixth preferred aspect of the transparent conductive film according to the present invention, the crystalline layer of first indium tin oxide has a tin oxide content of 6% by weight to 15% by weight and the crystalline layer of second indium tin oxide has a tin oxide content of 1% by weight to 5% by weight.

In a seventh preferred aspect of the transparent conductive film according to the present invention, the difference between the tin oxide content of the crystalline layer of first indium tin oxide and the tin oxide content of the crystalline layer of second indium tin oxide is 3% by weight to 10% by weight.

In an eighth preferred aspect of the transparent conductive film according to the present invention, the crystalline layer of first indium tin oxide has a thickness of 3 nm to 15 nm and the crystalline layer of second indium tin oxide has a thickness of 7 nm to 30 nm.

In a ninth preferred aspect of the transparent conductive film according to the present invention, the difference between the thickness of the crystalline layer of second indium tin oxide and the thickness of the crystalline layer of first indium tin oxide is 1 nm to 15 nm.

In a tenth preferred aspect of the transparent conductive film according to the present invention, the pressure-sensitive adhesive layer has a refractive index of 1.45 to 1.50.

In an eleventh preferred aspect of the transparent conductive film according to the present invention, the pressure-sensitive adhesive layer has a thickness of 10 μm to 500 μm.

In a twelfth preferred aspect of the transparent conductive film according to the present invention, when an average reflectivity of light at a wavelength of 450 nm to 650 nm in a portion with transparent conductor patterns is $R_1$(%) and an average reflectivity of light at a wavelength of 450 nm to 650 nm in a portion without transparent conductor patterns is $R_2$(%), and $\Delta R$ (%) is an absolute value of the difference between the average reflectivity $R_1$ and the average reflectivity $R_2$, ($\Delta R=|R_1-R_2|$) and $\Delta R$ is 0.7% or lower.

In a thirteenth preferred aspect of the transparent conductive film according to the present invention, the transparent conductor patterns respectively have a surface resistance value of less than 150 Ω/square.

ADVANTAGE OF THE INVENTION

According to the present invention, it is possible to reduce the difference $\Delta R$ between the reflectivity $R_1$ in a portion with transparent conductor patterns and the reflectivity $R_2$ in a portion without transparent conductor patterns than ever before. As a result, it is possible to obtain transparent conductive films in which transparent conductor patterns are less visible than conventional products.

BRIEF DESCRIPTION OF THE DRAWING

FIG. 1 shows a plan view and a schematic cross-sectional view of a transparent conductive film of the present invention.

DESCRIPTION OF THE PREFERRED EMBODIMENTS

The preferred embodiments of the present invention will now be described with reference to FIG. 1. Identical elements in the FIGURE are designated with the same reference numerals.

As a result of careful study to solve the aforementioned problem, the inventors of the present invention have found out that it is possible to reduce the difference ΔR between the reflectivity $R_1$ of a portion with transparent conductor patterns and the reflectivity $R_2$ of a portion without transparent conductor patterns more than ever before.

[Transparent Conductive Film]

As shown in FIG. 1, a transparent conductive film 10 of the present invention comprises: a film substrate 11; a plurality of transparent conductor patterns 12 formed on the film substrate 11; and a pressure-sensitive adhesive layer 13 in which the plurality of transparent conductor patterns 12 are embedded. The transparent conductor patterns 12 respectively have a two-layer structure where a crystalline layer 14 of first indium tin oxide and a crystalline layer 15 of second indium tin oxide are laminated. The term "a crystalline layer 14 of first indium tin oxide" is hereinafter referred to as "a first indium tin oxide layer 14" and the term "a crystalline layer 15 of second indium tin oxide" is hereinafter referred to as "a second indium tin oxide layer 15."

[Film Substrate]

The film substrate 11 to be used in the present invention is preferably superior in transparency and heat resistance. Examples of a material for the film substrate 11 include polyethylene terephthalate, polycycloolefin or polycarbonate. The film substrate 11 may include an easily adhesive layer, an undercoat layer or a hard coating layer formed on a surface thereof. The easily adhesive layer has the function to increase tightness of the transparent conductor patterns 12 and the film substrate 11. The undercoat layer functions to adjust the reflectivity of the film substrate 11. The hard coating layer functions to prevent the surface of the film substrate 11 from being damaged. The film substrate 11 typically has a thickness of 10 μm to 200 μm. When the thickness of the film substrate 11 is small, there is little volatile substance from the film substrate 11, so that film formation of the indium tin oxide layer is good. Accordingly, the film substrate 11 preferably has a thickness of 20 μm to 50 μm.

[Transparent Conductor Pattern]

The transparent conductor patterns 12 to be used in the present invention respectively have a two-layer structure where a first indium tin oxide layer 14 and a second indium tin oxide layer 15 are laminated. The first indium tin oxide layer 14 is arranged on a side near the film substrate 11 and the second indium tin oxide layer 15 is arranged on a side away from the film substrate 11.

The shape of the transparent conductor patterns 12 is not particularly limited, but may be in the shape of a stripe as shown in FIG. 1 or may be in the shape of a diamond not shown. The respective transparent conductor patterns 12 preferably have a thickness (thickness of the first indium tin oxide layer 14+thickness of the second indium tin oxide layer 15) of 10 nm to 45 nm, more preferably 15 nm to 30 nm.

The first indium tin oxide layer 14 and the second indium tin oxide layer 15 to be used in the present invention are layers made of compounds in which tin oxide ($SnO_2$) is doped with indium oxide ($In_2O_3$). Examples of the first indium tin oxide layer 14 and the second indium tin oxide layer 15 to be used in the present invention typically include crystalline layers obtained by respectively crystallizing an amorphous layer of indium tin oxide by heat-treatment.

The tin oxide content of the first indium tin oxide layer 14 is greater than that of the second indium tin oxide layer 15. The tin oxide content of the first indium tin oxide layer 14 is preferably 6% by weight to 15% by weight, more preferably 8% by weight to 12% by weight. The tin oxide content of the second indium tin oxide layer 15 is preferably 1% by weight to 5% by weight, more preferably 2% by weight to 4% by weight. The difference in tin oxide content between the first indium tin oxide layer 14 and the second indium tin oxide layer 15 is preferably 3% by weight to 10% by weight, more preferably 5% by weight to 8% by weight. The tin oxide content (% by weight) herein represents {weight of tin oxide/(weight of indium oxide+weight of tin oxide)}×100(%).

In general, as the content of tin oxide is greater, an indium tin oxide layer has a lower surface resistance value, however, the crystallization time thereof tends to be longer. In the transparent conductive film 10 of the present invention, however, the second indium tin oxide layer 15 having less tin oxide content promotes crystal growth of the first indium tin oxide layer 14 having greater tin oxide content. This makes it possible to make the surface resistance value of the transparent conductive film 10 small, shortening the crystallization time of the transparent conductor patterns 12.

The thickness of the first indium tin oxide layer 14 is preferably smaller than that of the second indium tin oxide layer 15. The first indium tin oxide layer 14 preferably has a thickness of 3 nm to 15 nm, more preferably 5 nm to 10 nm. The second indium tin oxide layer 15 preferably has a thickness of 7 nm to 30 nm, more preferably 10 nm to 20 nm. The difference in thickness between the first indium tin oxide layer 14 and the second indium tin oxide layer 15 is preferably 1 nm to 15 nm, more preferably 2 nm to 10 nm.

The transparent conductor patterns 12 are promoted to be crystallized by limiting the thickness and the tin oxide content of the first indium tin oxide layer 14 and the thickness and the tin oxide content of the second indium tin oxide layer 15 to the above-mentioned range. And it is possible to reduce each surface resistance value of the transparent conductive film 10 by heat treatment at a low temperature and for a short period of time. In the transparent conductive film 10 of the present invention, it is possible to set the surface resistance value of the transparent conductor patterns 12 at less than 150 ohms per square by low temperature heat treatment conditions such as 140° C.

[Pressure-sensitive Adhesive Layer]

The pressure-sensitive adhesive layer 13 to be used for the transparent conductive film 10 of the present invention is formed on the film substrate 11, in which the transparent conductor patterns 12 are embedded. A preferable example of a material for forming the pressure-sensitive adhesive layer 13 includes an acrylic adhesive because of superior transparency. The pressure-sensitive adhesive layer 13 preferably has a refractive index of 1.45 to 1.50 from a view point of improving the effects of the present invention. The pressure-sensitive adhesive layer 13 preferably has a thickness of 10 μm to 500 μm, more preferably 100 μm to 500 μm. In addition, when the transparent conductive film 10 of the present invention is used for a smart phone, a cover glass is typically laminated on the pressure-sensitive adhesive layer 13.

In the transparent conductive film 10 of the present invention, the difference between the reflectivity of a portion with the transparent conductor patterns 12 and the reflectivity of a portion without the transparent conductor patterns 12 is smaller than ever before. As a result, the transparent conductor patterns 12 of the transparent conductive film 10 according to the present invention is less visible than ever before. $R_1$(%) represents an average reflectivity of light at a wavelength of 450 nm to 650 nm of a portion with the transparent conductor patterns 12 and $R_2$(%) represents an average reflectivity of light at a wavelength of 450 nm to 650 nm of a portion without the transparent conductor patterns 12. ΔR (%) represents an absolute value of the difference between the average reflectivity $R_1$ and the average reflectivity $R_2$ ($\Delta R=|R_1-R_2|$). In the transparent conductive film 10 of the present invention, $\Delta R$ may be preferably 0.7% or lower. More preferably, $\Delta R$ may be 0.3% to 0.5%. In the present invention, each transparent conductor pattern 12 is a two-layer structure consisting of the first indium tin oxide layer 14 and the second indium tin oxide layer 15. Accordingly, the difference between the average reflectivity $R_1$ of the portion with the transparent conductor patterns 12 and the average reflectivity $R_2$ of the portion without the transparent conductor patterns 12 is smaller than ever before.

[Manufacturing Method]

One example of a method for manufacturing the transparent conductive film 10 of the present invention will now be described in detail. The long film substrate 11 made of a roll of 500 m to 5,000 m is located in a sputtering device. A first indium tin oxide layer and a second indium tin oxide layer are continuously formed on the film substrate 11 by sputtering while rewinding the film substrate 11 at a predetermined speed. In the sputtering method, cation in a plasma generated in a low-pressure gas (for instance, a low-pressure argon gas) is caused to collide with a sintering body target (negative electrode) of indium tin oxide. Indium tin oxide scattered from a surface of the sintering body target is caused to attach on the film substrate 11. At this time, at least two sintering body targets of indium tin oxide each having a different tin oxide content are provided in the sputtering device. This makes it possible to continuously form the first indium tin oxide layer and the second indium tin oxide layer. After sputtering, the first indium tin oxide layer and the second indium tin oxide layer before being heat-treated are amorphous layers, either.

The film substrate 11, on which the first indium tin oxide layer and the second indium tin oxide layer are formed, is wound up to be rolled. The film substrate 11 in a roll shape is continuously carried in a heating oven while being rewound to cause the first indium tin oxide layer and the second indium tin oxide layer to be heat-treated. The heating temperature is preferably 130° C. to 170° C. and the heating time is preferably 30 minutes to 60 minutes. The first indium tin oxide layer and the second indium tin oxide layer are converted from being amorphous to being crystal. In such a manner, the transparent conductive film 10 having a transparent conductor layer on which the first indium tin oxide layer and the second indium tin oxide layer are formed is obtained. In the present invention, the crystallization of the transparent conductor layer is promoted by the limitation of the thickness and the tin oxide content of the first indium tin oxide layer and the thickness and the tin oxide content of the second indium tin oxide layer to a specified range, which enables the transparent conductor layer to be crystallized by heat treatment at a low temperature and in a short period of time.

After that, a photoresist layer in the form of a desired pattern is formed on a surface of the transparent conductor layer (a surface of the second indium tin oxide layer). An unnecessary portion of the transparent conductor layer (a portion not covered with a photoresist) is removed by immersing the transparent conductor layer into hydrochloric acid to obtain the transparent conductor patterns 12 (a laminate composed of the first indium tin oxide layer 14 and the second indium tin oxide layer 15).

Finally, the pressure-sensitive adhesive layer 13 is laminated on the film substrate 11 having the transparent conductor patterns 12 so as to embed the transparent conductor patterns 12 to obtain the transparent conductive film 10 of the present invention.

EXAMPLES

Example 1

Firstly, an undercoat layer (thickness: 30 nm) made of a thermosetting resin including a melamine resin was formed on a polyethylene terephthalate film with a thickness of 23 μm to prepare a film substrate 11. The roll-shaped film substrate 11 was arranged in a sputtering device. The atmosphere in the sputtering device was gas pressure of 0.4 Pa and the gas was composed of 80% by volume of argon gas and 20% by volume of oxygen gas. An amorphous layer of first indium tin oxide and a second amorphous layer of second indium tin oxide were sequentially formed on the film substrate 11 while rewinding the roll-shaped film substrate 11 at a fixed rate to form a transparent conductor layer with a thickness of 20 nm. The amorphous layer of first indium tin oxide had a tin oxide content of 10% by weight and a thickness of 8 nm. The amorphous layer of second indium tin oxide had a tin oxide content of 3.3% by weight and a thickness of 12 nm. The film substrate 11 on which the amorphous layer of first indium tin oxide and the amorphous layer of second indium tin oxide were formed was once rewound to be in the shape of a roll.

Secondly, the roll-shaped film substrate 11 was continuously carried in a heating oven at 140° C. while having been rewound to perform heat treatment. The amorphous layer of first indium tin oxide was converted into a crystalline layer and the amorphous layer of second indium tin oxide was converted into a crystalline layer after the heat treatment. As a result, the film substrate 11 wherein the first indium tin oxide layer 14 and the second indium tin oxide layer 15 were formed on a surface thereof was obtained. The thickness and the tin oxide content of the first indium tin oxide layer were the same as before the heat treatment. The thickness and the tin oxide content of the second indium tin oxide layer were the same as before the heat treatment.

Thirdly, a photoresist layer in the form of a stripe pattern was formed on a surface of the second indium tin oxide layer 15. Subsequently, the transparent conductor layer was immersed in hydrochloric acid to remove an unnecessary portion (portion where not being covered with the photoresist) of the transparent conductor layer, which leads to obtain the transparent conductor patterns 12.

Finally, an acrylic-based pressure-sensitive adhesive layer 13 (manufactured by Nitto Denko Corporation; product name: "LUCIACS" (Trademark) CS9621) (thickness 50 μm, refractivity of 1.47) was laminated on the film substrate 11 so as to embed the transparent conductor patterns 12 to obtain a transparent conductive film 10. Table 1 shows characteristics of the thus obtained transparent conductive film 10.

Comparative Example 1

First indium tin oxide was set to have a tin oxide content of 3.3% by weight and a thickness of 12 nm. Second indium tin oxide was set to have a tin oxide content of 10% by weight and a thickness of 8 nm. The total thickness of the transparent conductor layer was 20 nm that was the same as Example 1. A transparent conductive film was produced in the same manner as in Example 1 except for the above. Table 1 shows characteristics of the thus obtained transparent conductive film.

Comparative Example 2

The transparent conductor layer set to be single-layered. Indium tin oxide was set to have a tin oxide content of 3.3% by weight and a thickness of 23 nm. A transparent conductive film was produced in the same manner as in Example 1 except for the above. Table 1 shows characteristics of the obtained transparent conductive film.

Comparative Example 3

The transparent conductor layer was set to be single-layered. Indium tin oxide was set to have a tin oxide content of 10% by weight and a thickness of 23 nm. A transparent conductive film was produced in the same manner as in Example 1 except for the above. Table 1 shows characteristics of the thus obtained transparent conductive film.

TABLE 1

| | Transparent conductor patterns Tin oxide content (% by weight) Layer thickness (nm) | | | | Surface resistance | Crystallization time |
|---|---|---|---|---|---|---|
| | Structure | First | Second | ΔR (%) | (Ω/square) | (minute) |
| Example 1 | Two-layer | 10% 8 nm | 3.3% 12 nm | 0.47 | 130 | 30 |
| Comparative Example 1 | Two-layer | 3.3% 12 nm | 10% 8 nm | 0.93 | 150 | 60 |
| Comparative Example 2 | Single layer | 3.3% 23 nm | — | 1.00 | 270 | 30 |
| Comparative Example 3 | Single layer | 10% 23 nm | — | 0.81 | 150 | 90 |

First: Crystalline layer of first indium tin oxide
Second: Crystalline layer of second indium tin oxide
ΔR: Reflectivity difference between a portion with transparent conductor patterns and a portion without transparent conductor patterns

[Evaluation]

As shown in Table 1, in the transparent conductive film (Example 1) of the present invention, the tin oxide content of the first indium tin oxide layer is greater than that of the second indium tin oxide layer. Further, the thickness of the first indium tin oxide layer is smaller than that of the second indium tin oxide layer. Accordingly, it was possible to reduce the difference ΔR between the reflectivity of the portion with transparent conductor patterns and the reflectivity of the portion without transparent conductor patterns than conventional conductive films. As a result, it was possible to obtain a transparent conductive film in which the transparent conductor patterns are less visible than ever before. Furthermore, in the transparent conductive film of the present invention (Example 1), it was possible to reduce the surface resistance value as well as reducing crystallization time of the transparent conductor patterns.

[Measuring Method]
[Reflectivity Difference ΔR]

After removing the pressure-sensitive adhesive layer from the transparent conductive film, an average reflectivity $R_1$(%) of light at a wavelength of 450 nm to 650 nm in a portion with transparent conductor patterns and an average reflectivity $R_2$(%) of light at a wavelength of 450 nm to 650 nm in a portion without transparent conductor patterns were measured using a spectrophotometer (manufactured by Hitachi, Ltd.; product name: U4100). Using the measured value, an absolute value of the reflectivity difference ΔR (%)=$|R_1-R_2|$ was calculated. When there is a pressure-sensitive adhesive layer, the average reflectivity $R_1$(%) of the portion with transparent conductor patterns and the average reflectivity $R_2$(%) of the portion without transparent conductor patterns become smaller to the same degree, so that the absolute value ΔR (%) of the reflectivity difference becomes a little smaller.

[Surface Resistance Value]

A surface resistance value was measured using a four-terminal method before laminating the pressure-sensitive adhesive layer on the transparent conductive film.

[Crystallization Time]

Crystallization time was determined at the time when the surface resistance value of the transparent conductive film became constant.

[Tin Oxide Content]

The tin oxide content of a sintering body target of indium tin oxide arranged in a sputtering device was determined as the tin oxide content of a crystalline layer of indium tin oxide.

[Layer Thickness]

The cross-section of an indium tin oxide layer was observed by using a transmission electron microscope (manufactured by Hitachi, Ltd.; product name: H-7650) to measure the thickness of the indium tin oxide layer.

INDUSTRIAL APPLICABILITY

While the usage of the transparent conductive film is not limited, in particular, the transparent conductive film of the present invention is preferably used for a projection capacitance-type touch panel.

This application claims priority from Japanese Patent Application No. 2011-221951, which is incorporated herein by reference.

There has thus been shown and described a novel transparent conductive film which fulfills all the objects and advantages sought therefor. Many changes, modifications, variations and other uses and applications of the subject invention will, however, become apparent to those skilled in the art after considering this specification and the accompanying drawings which disclose the preferred embodiments thereof. All such changes, modifications, variations and other uses and applications which do not depart from the spirit and scope of the invention are deemed to be covered by the invention, which is to be limited only by the claims which follow.

What is claimed is:

1. A transparent conductive film, comprising:
   a film substrate;
   a plurality of transparent conductor patterns formed on the film substrate; and
   a pressure-sensitive adhesive layer formed on the film substrate wherein the plurality of transparent conductor patterns are embedded,
   the transparent conductor patterns respectively have a two-layer structure wherein a crystalline layer of first indium tin oxide and a crystalline layer of second indium tin oxide are laminated on the film substrate in this order,
   the crystalline layer of first indium tin oxide has a greater tin oxide content than the crystalline layer of second indium tin oxide does,
   the crystalline layer of first indium tin oxide has a thickness smaller than that of the crystalline layer of second indium tin oxide, and
   the difference between the thickness of the crystalline layer of second indium tin oxide and the thickness of the crystalline layer of first indium tin oxide is 2 nm to 10 nm.

2. The transparent conductive film according to claim 1, wherein the crystalline layer of first indium tin oxide and the crystalline layer of second indium tin oxide are formed by respectively crystallizing an amorphous layer of indium tin oxide by heat treatment.

3. The transparent conductive film according to claim 1, wherein a material of the film substrate includes polyethylene tetraphthalate, polycycloolefin or polycarbonate.

4. The transparent conductive film according to claim 1, wherein the plurality of transparent conductor patterns respectively have a thickness (thickness of the crystalline layer of first indium tin oxide+thickness of the crystalline layer of second indium tin oxide) of 10 nm to 45 nm.

5. The transparent conductive film according to claim 1, wherein the crystalline layer of first indium tin oxide has a tin oxide content of 6% by weight to 15% by weight and the crystalline layer of second indium tin oxide has a tin oxide content of 1% by weight to 5% by weight.

6. The transparent conductive film according to claim 5, wherein the difference between the tin oxide content of the crystalline layer of first indium tin oxide and the tin oxide content of the crystalline layer of second indium tin oxide is 3% by weight to 10% by weight.

7. The transparent conductive film according to claim 1, wherein the crystalline layer of first indium tin oxide has a thickness of 3 nm to 15 nm and the crystalline layer of second indium tin oxide has a thickness of 7 nm to 25 nm.

8. The transparent conductive film according to claim 1, wherein the pressure-sensitive adhesive layer has a refractive index of 1.45 to 1.50.

9. The transparent conductive film according to claim 1, when an average reflectivity of light at a wavelength of 450 nm to 650 nm in a portion with transparent conductor patterns is $R_1(\%)$ and an average reflectivity of light at a wavelength of 450 nm to 650 nm in a portion without transparent conductor patterns is $R_2(\%)$, and $\Delta R$ (%) is an absolute value of the difference between the average reflectivity $R_1$ and the average reflectivity $R_2$, ($\Delta R=|R_1-R_2|$) and $\Delta R$ is 0.7% or lower.

10. The transparent conductive film according to claim 1, wherein the transparent conductor patterns respectively have a surface resistance value of less than 150 ohms per square.

\* \* \* \* \*